(12) United States Patent
Miao et al.

(10) Patent No.: US 11,659,781 B2
(45) Date of Patent: May 23, 2023

(54) SELECTOR DEVICE AND METHOD OF MAKING THE SAME

(71) Applicant: Huazhong University of Science and Technology, Wuhan (CN)

(72) Inventors: Xiangshui Miao, Wuhan (CN); Qi Lin, Wuhan (CN); Hao Tong, Wuhan (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 0 days.

(21) Appl. No.: 16/655,191

(22) Filed: Oct. 16, 2019

(65) Prior Publication Data

US 2020/0052205 A1     Feb. 13, 2020

Related U.S. Application Data

(63) Continuation-in-part of application No. PCT/CN2018/090244, filed on Jun. 7, 2018.

(30) Foreign Application Priority Data

Sep. 29, 2017     (CN) .......................... 201710902924.4

(51) Int. Cl.
*H01L 27/24*     (2006.01)
*H01L 45/00*     (2006.01)

(52) U.S. Cl.
CPC ............ *H01L 45/141* (2013.01); *H01L 27/24* (2013.01); *H01L 45/1253* (2013.01); *H01L 45/1608* (2013.01); *H01L 45/1675* (2013.01)

(58) Field of Classification Search
CPC . H01L 27/24; H01L 45/1675; H01L 45/1253; H01L 45/141; H01L 45/1608; H01L 27/2427; H01L 45/12; H01L 45/14
USPC .............................................................. 257/4
See application file for complete search history.

(56) References Cited

U.S. PATENT DOCUMENTS

| 9,159,911 | B2* | 10/2015 | Kunikiyo | H01L 45/144 |
| 10,483,462 | B1* | 11/2019 | Jo | H01L 45/14 |
| 2007/0007506 | A1* | 1/2007 | Campbell | H01L 45/1625 257/2 |
| 2009/0039337 | A1* | 2/2009 | Ohba | H01L 27/101 257/E47.001 |
| 2009/0122465 | A1 | 5/2009 | Lin | |
| 2012/0008370 | A1* | 1/2012 | Yasuda | H01L 45/142 257/3 |

(Continued)

FOREIGN PATENT DOCUMENTS

| CN | 1965418 A | 5/2007 |
| CN | 102683378 | * 9/2012 |

(Continued)

*Primary Examiner* — Fazli Erdem
(74) *Attorney, Agent, or Firm* — JCIPRNET

(57) ABSTRACT

A selector device including a first metal electrode layer, a second metal electrode layer and a switching layer disposed between the first metal electrode layer and the second metal electrode layer. The switching layer is a stacked assembly of ABA, BAB, AB or BA, where A is an ion supply layer, and B is a conversion layer. The ion supply layer includes a chalcogenide metal material having a metal atomic content of more than 0% and not more than 50% with respect to the chalcogenide metal material. The conversion layer includes a chalcogenide material.

9 Claims, 4 Drawing Sheets

(56) References Cited

U.S. PATENT DOCUMENTS

| | | | | |
|---|---|---|---|---|
| 2012/0091422 A1* | 4/2012 | Choi | ................... | H01L 27/2463 |
| | | | | 257/E45.001 |
| 2012/0145987 A1* | 6/2012 | Sei | ......................... | H01L 45/08 |
| | | | | 257/E21.09 |
| 2013/0001497 A1* | 1/2013 | Ohba | .................. | H01L 27/2472 |
| | | | | 257/E21.52 |
| 2015/0072499 A1* | 3/2015 | Ohba | .................. | H01L 45/1608 |
| | | | | 438/382 |
| 2015/0090947 A1* | 4/2015 | Marsh | ................ | H01L 45/1233 |
| | | | | 257/2 |
| 2016/0233420 A1* | 8/2016 | Troyan | ................ | H01L 45/1233 |
| 2017/0069839 A1* | 3/2017 | Troyan | ................... | H01L 45/12 |
| 2018/0212143 A1* | 7/2018 | Tseng | ...................... | H01L 45/16 |
| 2019/0027219 A1* | 1/2019 | Nazarian | ............ | G11C 13/0097 |
| 2020/0381372 A1* | 12/2020 | Kozicki | .............. | H01L 45/1233 |

FOREIGN PATENT DOCUMENTS

| | | | |
|---|---|---|---|
| CN | 103650215 | * | 3/2014 |
| CN | 104659208 A | | 5/2015 |
| CN | 106992251 A | | 7/2017 |
| CN | 107732010 A | | 2/2018 |
| JP | 2014179571 | * | 9/2014 |
| WO | 2016122406 A1 | | 8/2016 |

* cited by examiner

SELECTOR DEVICE AND METHOD OF MAKING THE SAME

CROSS-REFERENCE TO RELATED APPLICATIONS

This application is a continuation-in-part of International Patent Application No. PCT/CN2018/090244 with an international filing date of Jun. 7, 2018, designating the United States, and further claims foreign priority benefits to Chinese Patent Application No. 201710902924.4 filed Sep. 29, 2017. The contents of all of the aforementioned applications, including any intervening amendments thereto, are incorporated herein by reference.

BACKGROUND

The disclosure relates to a selector device and a method of making the same.

In telecommunication technology, a selector device can selectively open (activate) or close (deactivate) ion channels as needed under certain circumstances. Selection technology can be employed to realize high density large-scale storage array and reduce operating power consumption of the storage device.

Conventional selector devices include ovonic threshold switches (OTS), metal insulator transition devices (MIT), mixed ionic and electronic conductors (MIEC) and wire-based threshold switching devices. OST and MIT have a relatively small on-off current radio and relatively large leakage current, MIEC involves complex materials, and the on-state current of the wire-based threshold switching devices is below 100 µA.

SUMMARY

The disclosure provides a selector device comprising: a first metal electrode layer, a second metal electrode layer and a switching layer disposed between the first metal electrode layer and the second metal electrode layer.

The switching layer is a symmetric structure or an asymmetric structure; the symmetric structure is a stacked assembly of ABA or BAB; the asymmetric structure is a stacked assembly of AB or BA, where A is an ion supply layer, and B is a conversion layer; the ion supply layer comprises a chalcogenide metal material having a metal atomic content of more than 0% and not more than 50% with respect to the chalcogenide metal material; and the conversion layer comprises a chalcogenide material.

The constituent elements of the ion supply layer and the conversion layer are the same or not the same, and an atomic percentage of the ion supply layer is different from that of the conversion layer.

The chalcogenide metal material of the ion supply layer is $AgS_x$, $AgSe_x$, $AgTe_x$, $CuS_x$, $CuSe_x$, $CuTe_x$, or a mixture thereof, or $AgS_x$, $AgSe_x$, $AgTe_x$, $CuS_x$, $CuSe_x$, or $CuTe_x$ doped with a metal, or a mixture thereof.

The chalcogenide material of the conversion layer is $GeTe_x$, $GeSe_x$, $GeS_x$, $GeSbTe_x$, $GeSb_x$, $GeO_x$, $SbTe_x$, SbS, SbSe, BiSe, BiS, BiTe, AsTe, AsSe, SnTe, BiTe, AgInSbTe, $AgS_x$, $AgSe_x$, $AgTe_x$, $CuS_x$, $CuSe_x$, $CuTe_x$, or a mixture thereof, or $GeTe_x$, $GeSe_x$, $GeS_x$, $GeSbTe_x$, $GeSb_x$, $GeO_x$, $SbTe_x$, SbS, SbSe, BiSe, BiS, BiTe, AsTe, AsSe, SnTe, BiTe, AgInSbTe, $AgS_x$, $AgSe_x$, $AgTe_x$, $CuS_x$, $CuSe_x$, or $CuTe_x$ doped with S, N, O or Si, or a mixture thereof.

The ion supply layer has a thickness of 1 to 40 nm, and the conversion layer has a thickness of 1 to 20 nm.

The first metal electrode layer and the second metal electrode layer comprise an electrode material selected from platinum (Pt), titanium (Ti), tungsten (W), gold (Au), ruthenium (Ru), aluminum (Al), TiW, TiN, TaN, $IrO_2$, ITO, IZO, or a mixture thereof.

The first metal electrode layer or the second metal electrode layer can be encapsulated in the switching layer, and the switching layer comprises an outer layer in direct contact with the second metal electrode layer or the first metal electrode layer.

A method of preparing the selector device comprises:
1) providing a substrate;
2) depositing a first metal electrode layer on the substrate;
3) depositing an electrical insulating layer on the first metal electrode layer, and patterning the electrical insulating layer to obtain nanopores and expose the first metal electrode layer;
4) patterning the electrical insulating layer again, and alternately depositing an ion supply layer A and a conversion layer B to yield a stacked assembly of AB, BA, ABA, or BAB to form a switching layer; and
5) depositing a second metal electrode layer on the switching layer.

In 3), the nanopores is obtained by etching the electrical insulating layer through electron beam lithography (EBL) and inductively coupled plasma (ICP).

Advantages of the selector device according to embodiments of the disclosure are summarized as follows:

Compared with the conventional selector device, the selector device provided by the disclosure has higher on-state current, higher on-off current radio, lower subthreshold swing. The high on-state current ensures the selector device can be widely used in different storage devices; the high on-off current radio effectively suppresses the leakage current, reduces the operating power consumption and avoids read errors; the low subthreshold swing gives the selector device the abilities to turn on quickly and have a high integration.

The preparation method of the disclosure can be implemented without thermal phase changes. The prepared selector device can be vertically integrated with the memory cells to suppress the leakage current, thus increasing the memory density and reducing the operational power consumption of the storage devices.

Figure 1:
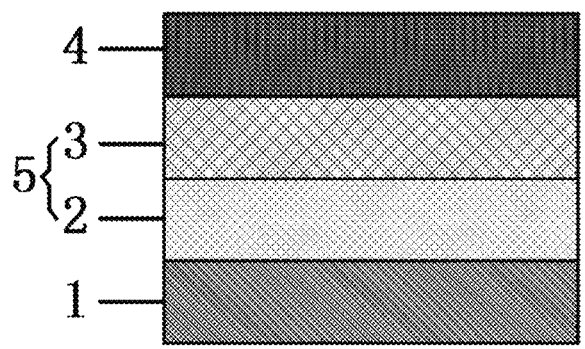
FIG. 1 is a structure diagram of a selector device according to one embodiment of the disclosure.

In the drawings, the following reference numbers are used: 1. First metal electrode layer, 2. Conversion layer, 3. Second ion supply layer, 4. Second metal electrode layer, 5. Asymmetric structure, 6. First ion supply layer, 7. Symmetric structure, 8. Substrate, 9. First metal electrode layer, 10. Electrical insulating layer, 11. Chalcogenide material having a laminated structure, 12. Second metal electrode layer, 13.

Figure 4:
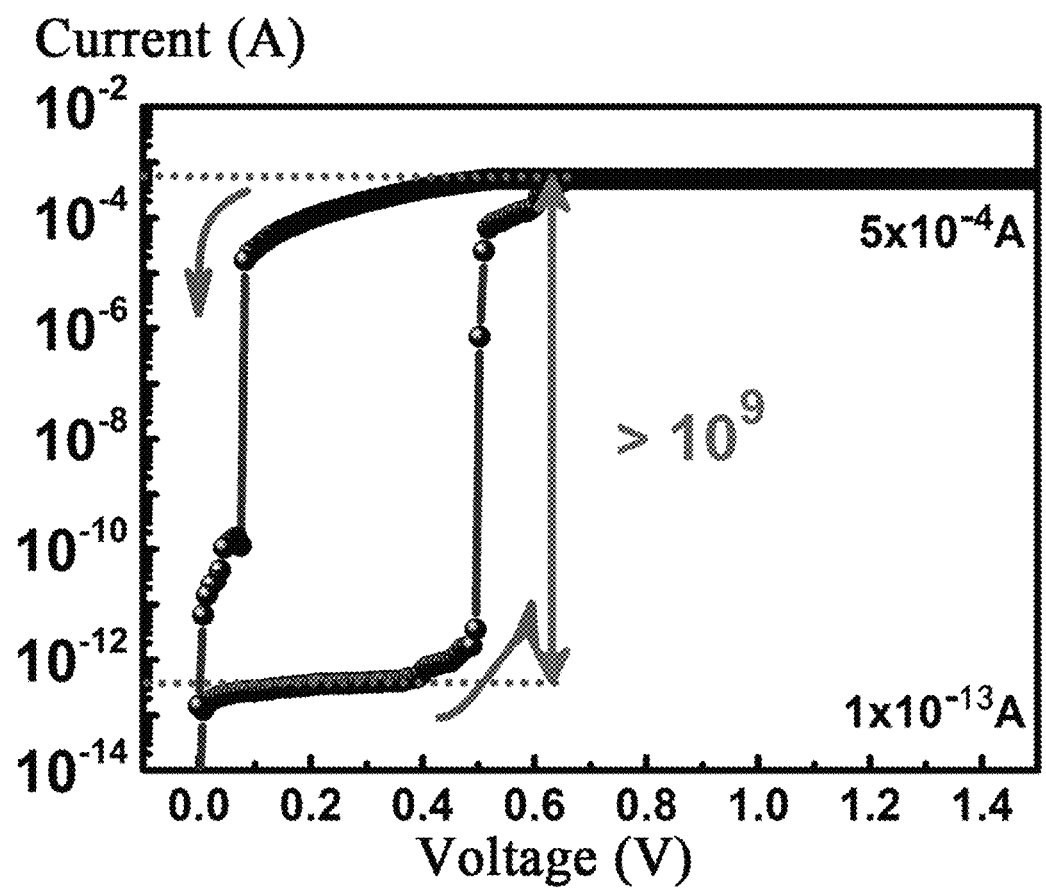
FIG. 4 is a graph showing measured current-voltage of a selector device according to one embodiment of the disclosure.

Graph showing DC current-voltage of a selector device, and 14, the graph showing subthreshold swing of the enlarged graph in FIG. 4.

DETAINED DESCRIPTION

To further illustrate, embodiments detailing a selector device and a method of making the same are described below. It should be noted that the following embodiments are intended to describe and not to limit the disclosure.

The disclosure provides a selector device comprising a first metal electrode layer, a second metal electrode layer and a switching layer disposed between the first metal electrode layer and the second metal electrode layer.

The switching layer is a symmetric structure or an asymmetric structure formed by an ion supply layer A and a conversion layer B; the symmetric structure is a stacked assembly of ABA or BAB; the asymmetric structure is a stacked assembly of AB or BA; the ion supply layer comprises a chalcogenide metal material having a metal atomic content of more than 0% and not more than 50%; and the conversion layer comprises a chalcogenide material.

The asymmetric structure has the characteristics of unidirectional conducting, which is suitable for unipolar devices, such as phase change memory, unipolar resistive memory and etc.; while the symmetrical structure has the characteristics of bidirectional conducting, which is suitable for unipolar and bipolar devices, such as unipolar and bipolar resistive random access memory, phase change memory, magnetic memory and etc.

In certain embodiments, the constituent elements of the ion supply layer and the conversion layer are not completely the same, or the constituent elements of the ion supply layer and the conversion layer are completely the same, but the atomic percentage of the ion supply layer is different from that of the conversion layer.

In certain embodiments, the chalcogenide metal material of the ion supply layer is $AgS_x$, $AgSe_x$, $AgTe_x$, $CuS_x$, $CuSe_x$, $CuTe_x$, or a mixture thereof, or $AgS_x$, $AgSe_x$, $AgTe_x$, $CuS_x$, $CuSe_x$, or $CuTe_x$ doped with a metal, or a mixture thereof.

In certain embodiments, the chalcogenide material of the conversion layer is $GeTe_x$, $GeSe_x$, $GeS_x$, $GeSbTe_x$, $GeSb_x$, $GeO_x$, $SbTe_x$, SbS, SbSe, BiSe, BiS, BiTe, AsTe, AsSe, SnTe, BiTe, AgInSbTe, $AgS_x$, $AgSe_x$, $AgTe_x$, $CuS_x$, $CuSe_x$, $CuTe_x$, or a mixture thereof, or $GeTe_x$, $GeSe_x$, $GeS_x$, $GeSbTe_x$, $GeSb_x$, $GeO_x$, $SbTe_x$, SbS, SbSe, BiSe, BiS, BiTe, AsTe, AsSe, SnTe, BiTe, AgInSbTe, $AgS_x$, $AgSe_x$, $AgTe_x$, $CuS_x$, $CuSe_x$, or $CuTe_x$ doped with S, N, O or Si, or a mixture thereof.

In certain embodiments, the ion supply layer has a thickness of 1 to 40 nm, and the conversion layer has a thickness of 1 to 20 nm.

In certain embodiments, the first metal electrode layer and the second metal electrode layer comprise an electrode material selected from platinum (Pt), titanium (Ti), tungsten (W), gold (Au), ruthenium (Ru), aluminum (Al), TiW, TiN, TaN, $IrO_2$, ITO, IZO, or a mixture thereof.

In certain embodiments, in a vertical direction, the first metal electrode layer is regarded as an upper electrode layer, the second metal electrode layer is regarded as a lower electrode layer, and the switching layer is located between the upper electrode layer and the lower electrode layer; or in a horizontal direction, the first metal electrode layer is regarded as a left electrode layer, the second metal electrode layer is a right electrode layer, and the switching layer is located between the left electrode layer and the right electrode layer; or the switching layer encapsulating the first metal electrode layer or the second metal electrode layer, and the outer layer of the switching layer is in contact with another metal electrode layer; or the middle of the two metal electrode layers in different structure is used as a switching layer.

The disclosure also provides a method for preparing a selector device without thermal phase changes, which is specifically as follows:

first, a first metal electrode layer is deposited on the substrate, then an electrical insulating layer used for electrical isolation is deposited on the first metal electrode layer, next the electrical insulating layer is patterned to obtain nanopores and expose the first metal electrode layer, after that, the electrical insulating layer is patterned again, then, a switching layer is deposited. The structure of the switching layer can be divided into the following:

an ion supply layer A is first deposited, then a conversion layer B is deposited on the layer A to form an asymmetric structure of AB or BA, for the purpose of obtaining the characteristics of a diode-like unidirectional selector device; alternatively, a conversion layer B, an ion supply layer A, and another conversion layer B are sequentially deposited to form a symmetrical BAB structure or an ABA structure, for the purpose of obtaining the characteristics of a bidirectional selector device; finally, a second layer of inert metal electrode is deposited, wherein the materials of the upper and lower electrodes in the asymmetric structure may be the same or not the same to achieve a high rectification ratio, and the materials of the upper and lower electrodes in the symmetrical structure are the same to realize a symmetrical structure and characteristic.

Different nanopores structures can be obtained by using electron beam lithography (EBL) and inductive coupled plasma (ICP).

The disclosure will be further illustrated with reference to the drawings and embodiments.

As shown in FIG. 1, a structure of the selector device of the disclosure is as follows: a first inert metal electrode layer 1 is deposited on a substrate, a conversion layer 2 is deposited on the first metal electrodes layer 1, an ion supply layer 3 is deposited on the conversion layer 2, a second metal electrode layer 4 is deposited on the ion supply layer 3. The positions of the conversion layer and the ion supply layer are exchangeable. The selector device is an asymmetric structure 5 having the characteristic of unidirectional conducting, which is suitable for unipolar memory, such as unipolar resistive memory, phase change memory, etc.

Figure 2:
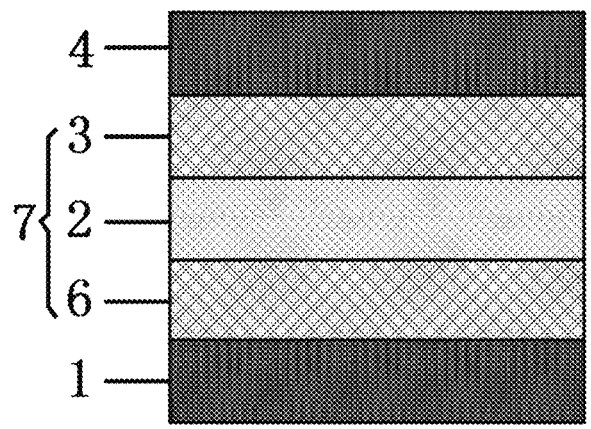
FIG. 2 is a structure diagram of another selector device according to one embodiment of the disclosure.

As shown in FIG. 2, a second structure of the selector device of the disclosure is as follows: a first metal electrode layer 1 is deposited on a substrate, a first ion supply layer 6 is deposited on the first metal electrode layer 1, a conversion layer 2 is deposited on the first ion supply layer 6, a second ion supply layer is deposited on the conversion layer 2, a second metal electrode 4 is deposited on the ion supply layer 3. Two layers of the ion supply layer may be replaced with the conversion layers, and the intermediate conversion layer may be replaced with the ion supply layer, and the device is still in a symmetrical structure. The symmetric structure 7 has the characteristics of unidirectional conducting, suitable for bipolar devices and unipolar devices, such as bipolar or unipolar resistive memory, phase change memory, etc.

The ion supply layer comprises a chalcogenide metal material having a metal atomic content of more than 0% and not more than 50%, providing a small amount of metal ions to form an unstable conductive filament and accelerate the breakage of the conductive filament to obtain a volatile switching characteristic.

The high instability of the conductive filament allows the device to maintain the volatile characteristic at a higher limiting current, which improves the current tolerance capability of the device and is also the reason why the on-state current of the device is higher in the example of the disclosure. The fast and effective breakage of the conductive filament allows the selector device to have the ability to turn off, and increase the off-state speed. The device mechanism is as follows: the ion supply layer contains metal ions that can move freely, so when the applied voltage of the device exceeds the threshold voltage, the metal ions migrates in the conversion layer and electrochemically react to form a conductive filament channel; when the voltage is less than a certain value, the metal ions rapidly diffuse into the conversion layer or migrate to the ion supply layer, causing the rupture of the conductive channel. Therefore, the ion supply layer provides a small amount of metal ions to form an unstable conductive channel, which tends to break and return to the initial off-state having a high-resistance when the voltage is less than a certain value; in addition, the ion supply layer is in a state where the active metal is not saturated, so that the active metal ions in the conductive channel can be pulled back more efficiently, further causing the breakage of the conductive filament channel. Under a high limiting current, the conductive filament easily forms a stable conductive channel that still remains even if the voltage is removed, so that the device cannot be turned off and has a nonvolatile resistance. The ion supply layer described in the disclosure, containing a small content of metal, makes the conductive filament more easily break at a high on-state current, thus making the device have high current tolerance and achieving a high on-state current. In addition, the active metal ions in the ion supply layer demand a high mobility to increase the opening speed and have good conductivity, for the purpose of forming a conductive channel with high conductivity.

The chalcogenide metal material of the ion supply layer is $AgS_x$, $AgSe_x$, $AgTe_x$, $CuS_x$, $CuSe_x$, or a mixture thereof, or $AgS_x$, $AgSe_x$, $AgSe_x$, $CuS_x$, $CuSe_x$, or $CuTe_x$ doped with a metal, or a mixture thereof, wherein the metal atomic content is more than 0% and not more than 50%. The conversion layer has a low electrical conductivity and is capable of dissolving the conductive channels formed by the active ions, which makes the active metal atoms or ions rapidly diffuse and move. The low conductivity ensures the device has a low off-state current during the off-state, which effectively suppresses the leakage current of the device. The typical loose structure of chalcogenide compound, can promote the rapid movement of the ions, thus rapidly forming a conductive channel at a high voltage, increasing the opening speed, and absorbing the metal atoms of the conductive channel when the voltage is less than a certain value, thus accelerating the breakage of the conductive filament. Under high voltage, the active ions provided by the ion supply layer migrate in the conversion layer and electrochemically react to form a conductive channel, converting the high-resistance state of the conversion layer to a low-resistance state. When the voltage drops to a certain value, the conductive channel breaks and the conversion layer is thus turned off because the low-resistance state is switched to the high resistance state.

The chalcogenide material of the conversion layer is $GeTe_x$, $GeSe_x$, $GeS_x$, $GeSbTe_x$, $GeSb_x$, $GeO_x$, $SbTe_x$, SbS, SbSe, BiSe, BiS, BiTe, AsTe, AsSe, SnTe, BiTe, AgInSbTe, $AgS_x$, $AgSe_x$, $AgTe_x$, $CuS_x$, $CuSe_x$, $CuTe_x$, or a mixture thereof, or $GeTe_x$, $GeSe_x$, $GeS_x$, $GeSbTe_x$, $GeSb_x$, $GeO_x$, $SbTe_x$, SbS, SbSe, BiSe, BiS, BiTe, AsTe, AsSe, SnTe, BiTe, AgInSbTe, $AgS_x$, $AgSe_x$, $AgTe_x$, $CuS_x$, $CuSe_x$, or $CuTe_x$ doped with S, N, O or Si, or a mixture thereof.

The constituent elements of the ion supply layer and the conversion layer are the same or not the same, and an atomic percentage of the ion supply layer is different from that of the conversion layer.

The two metal electrodes are both inert metal materials with a good electrical conductivity. The contact resistance between the electrode with good conductivity and the functional layer is small, and the electron-transporting ability is strong, thus increasing the on-state current of the device; the inert material effectively prevents the active metal ions in the laminated chalcogenide material from diffusing into the electrodes, thus improving the cycle characteristics of the device. The electrode material is Pt, Ti, W, Au, Ru, Al, TiW, TiN, TaN, $IrO_2$, ITO, and IZO, or a mixture thereof, or other inert metal materials having good conductivity.

The ion supply layer has a thickness of 1 to 40 nm, and the conversion layer has a thickness of 1 to 20 nm, or a large barrier is formed to lower the on-state current of the device due to the large thickness of the conversion layer.

FIGS. 3A-3D are a process flow diagram of a preparation of a selector device.

Figure 3A:
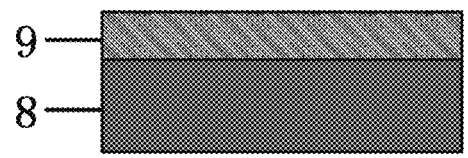
FIGS. 3A-3D are structure diagrams of preparing a selector device according to one embodiment of the disclosure.
Figure 3B:
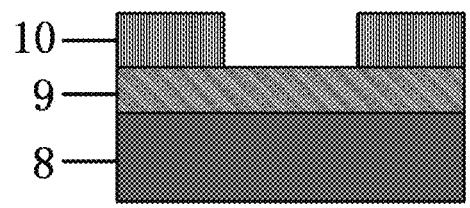
Figure 3C:
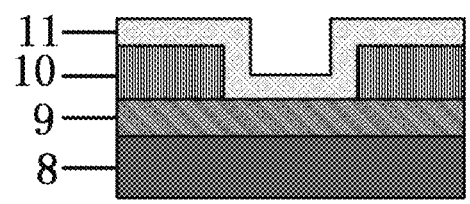
Figure 3D:
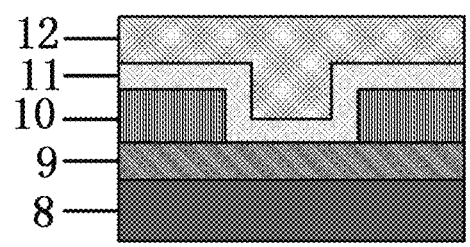

First, depositing a first metal electrode layer 9 on the substrate 8, as shown in FIG. 3A;

then, depositing an insulating electrical isolation layer, and adopting electron beam lithography (EBL) and inductively coupled plasma (ICP) etching process to obtain nanopores structure with a diameter of 250 nm and exposing the bottom electrode to obtain a patterned electrical isolation layer 10, as shown in FIG. 3B;

next, lithographically patterning and continuously depositing the chalcogenide material 11 having a laminated structure on the electrical insulating layer 10, as shown in FIG. 3C; and finally, depositing a second metal electrode layer 12 to obtain a sample of the device, and the structure is as shown in FIG. 3D.

A method for preparing a selector device was described using a selector device having an asymmetric lamination structure.

1. Depositing a first inert metal electrode layer, 1-10 nm Ti adhesion layer and 50-300 nm Pt on the substrate by magnetron sputtering, wherein Pt was selected as the inert metal electrode because of its good electrical conductivity and inertness;

2. using Plasma Enhanced Chemical Vapor Deposition (PECVD) to grow 50-200 nm $SiO_2$ as an insulating electrical isolation layer on the Pt inert electrode layer, the insulating electrical isolation layer was capable of protecting the material of the functional layer and improving the reliability of the device;

3. performing electron beam lithography (EBL) and inductively coupled plasma (ICP) etching on the $SiO_2$ electrical isolation layer to form the diversion holes and expose the first inert metal electrode layer;

4. performing a UV lithography for patterning the functional layer;

5. performing pulsed laser deposition of a conversion layer, wherein the chalcogenide material having a thickness of 1 to 20 nm may be GeTe, GST, GeSe, GeS, $GeSb_x$, $GeO_x$, etc., followed by magnetron sputtering deposition of an ion supply layer, wherein the chalcogenide material having a thickness of 1 to 40 nm is $AgS_x$, $AgSe_x$, $AgTe_x$, $CuS_x$, $CuSe_x$, and $CuTe_x$ (x>1), or a mixture thereof. Finally, depositing a second inert metal electrode layer of 50-300 nm TiW by magnetron sputtering. The conversion layer demands a low electrical conductivity, the strong ability of changing the resistance state, and a loose structure, so that the metal ions can rapidly diffuse, thus providing a small amount of metal ions with high mobility and good conductivity to form conductive channels and having the ability of reabsorbing metal ions to accelerate the breakage of the conductive filament.

FIG. 4 was a graph showing current-voltage curves in the example described in the disclosure. The device was turned on at approximately 0.5 V, that is, from the off-state to the on-state, which achieved an on-off current radio of more than $10^9$, enabling the selector device to have the capability of being applied to a large-scale memory array; the off-state leakage current was approximately 100 fA, a low leakage current allowed the device to effectively suppress leakage current, for the purpose of reducing operational power consumption and eliminating read errors caused by leakage current; the on-state current reached an on-state current of 500 μA, which satisfied the device to be integrated with a wide range of memory cells, and the device returned to the off-state when the voltage dropped below 0.1 V to maintain the voltage. Keeping at a low voltage not only avoided the insufficiency operation of the memory cell due to the voltage problem between the selector device and the memory cells after the selector device was turned on during the integration process, but also enabled low power operation.

Figure 5:
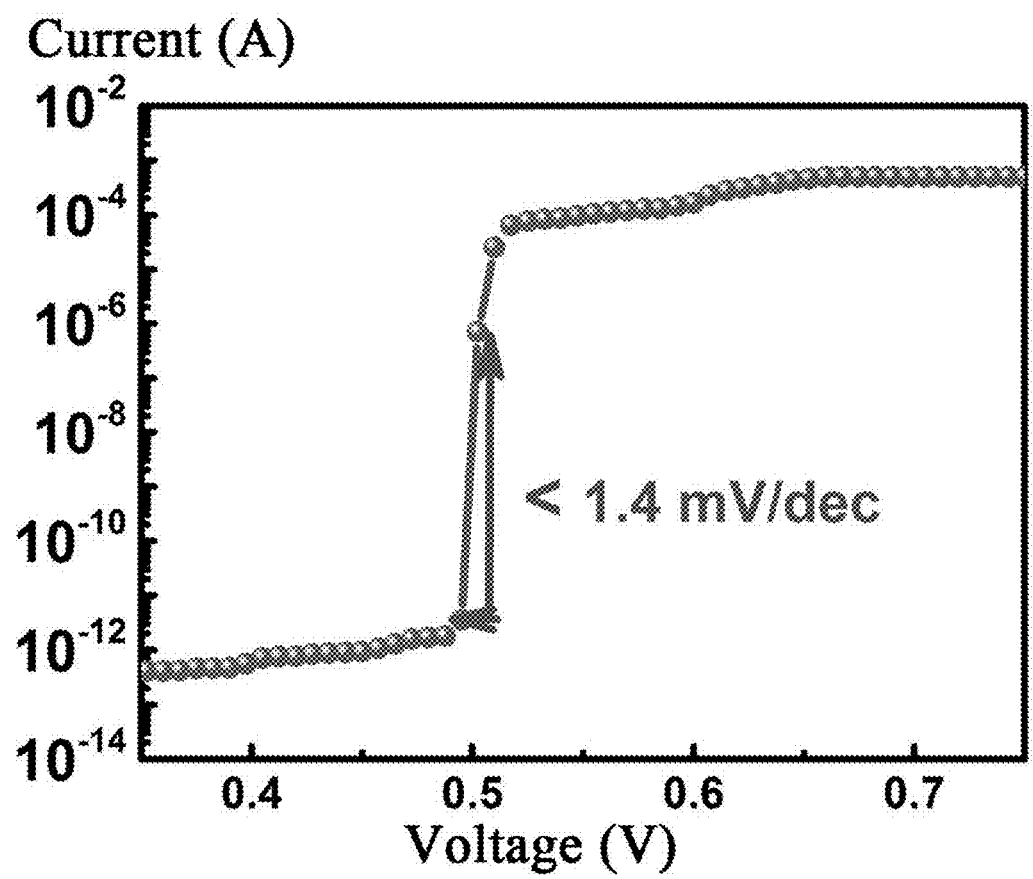
FIG. 5 is a partial graph showing a subthreshold swing of the enlarged graph in FIG. 4.

FIG. 5 was a partial graph showing the subthreshold swing of FIG. 4 after being enlarged; the data indicated that the device had a steep turn-on swing that was less than 1.4 mV/dec, illustrating that the device had a fast turn-on capability and effectively avoided a decrease in the size of the array due to mutual limitation between the on-state current and the on-off current radio, making the device can be applied in ultra-large-scale arrays.

It will be obvious to those skilled in the art that changes and modifications may be made, and therefore, the aim in the appended claims is to cover all such changes and modifications.

What is claimed is:

1. A device, comprising:
   1) A first metal electrode layer;
   2) A second metal electrode layer; and
   3) a switching layer disposed between the first metal electrode layer and the second metal electrode layer;
   wherein:
   the switching layer is a stacked assembly of ABA, BAB, AB or BA, where A is an ion supply layer, and B is a conversion layer;
   the ion supply layer comprises a chalcogenide metal material, wherein a metal atomic content of the chalcogenide metal material is more than 0% and less than 50% with respect to the chalcogenide metal material, wherein the ion supply layer is configured to form an unstable conductive filament and accelerate the breakage of the conductive filament to obtain a volatile switching characteristic; and
   the conversion layer comprises a chalcogenide material, wherein an atomic percentage of the ion supply layer is different from that of the conversion layer,
   wherein the chalcogenide metal material of the ion supply layer is $AgS_x$, $CuS_x$, or a mixture thereof, or $AgS_x$, or $CuS_x$ doped with a metal, or a mixture thereof.

2. The device of claim 1, wherein constituent elements of the ion supply layer and the conversion layer are the same or not the same.

3. The device of claim 1, wherein the chalcogenide material of the conversion layer is $GeS_x$, SbS, BiS, $AgS_x$, $CuS_x$, or a mixture thereof, or $GeS_x$, SbS, BiS, $AgS_x$, or $CuS_x$ doped with S, N, O or Si, or a mixture thereof.

4. The device of claim 3, wherein the ion supply layer has a thickness of 1 to 40 nm, and the conversion layer has a thickness of 1 to 20 nm.

5. The device of claim 4, wherein the first metal electrode layer and the second metal electrode layer comprise an electrode material selected from platinum (Pt), titanium (Ti), tungsten (W), gold (Au), ruthenium (Ru), aluminum (Al), TiW, TiN, tantalum nitride (TaN), $IrO_2$, ITO, IZO, or a mixture thereof.

6. The device of claim 5, wherein the first metal electrode layer or the second metal electrode layer is encapsulated in the switching layer, and the switching layer comprises an outer layer in direct contact with the second metal electrode layer or the first metal electrode layer.

7. A method of preparing the device of claim 1, comprising:
   1) Providing a substrate;
   2) Depositing a first metal electrode layer on the substrate;
   3) depositing an electrical insulating layer on the first metal electrode layer, and patterning the electrical insulating layer to obtain nanopores and expose the first metal electrode layer;
   4) patterning the electrical insulating layer again, and alternately depositing an ion supply layer A and a conversion layer B to yield a stacked assembly of AB, BA, ABA, or BAB to form a switching layer; and
   5) Depositing a second metal electrode layer on the switching layer,
   wherein the ion supply layer A comprises a chalcogenide metal material, wherein a metal atomic content of the chalcogenide metal material is more than 0% and less than 50% with respect to the chalcogenide metal material, wherein the ion supply layer A is configured to form an unstable conductive filament and accelerate the breakage of the conductive filament to obtain a volatile switching characteristic,
   wherein an atomic percentage of the ion supply layer A is different from that of the conversion layer B,
   wherein the chalcogenide metal material of the ion supply layer A is $AgS_x$, or $CuS_x$, or a mixture thereof, or $AgS_x$, or $CuS_x$ doped with a metal, or a mixture thereof.

8. The method of claim 7, wherein in 3), the nanopores is obtained by etching the electrical insulating layer through electron beam lithography (EBL) and inductively coupled plasma (ICP).

9. The method of claim 7, wherein the first metal electrode layer and the second metal electrode layer comprise an electrode material selected from platinum (Pt), titanium (Ti), tungsten (W), gold (Au), ruthenium (Ru), aluminum (Al), TiW, TiN, TaN, $IrO_2$, ITO, IZO, or a mixture thereof.

* * * * *